(12) United States Patent
Kim (10) Patent No.: US 7,675,102 B2
(45) Date of Patent: Mar. 9, 2010

(54) IMAGE SENSOR

(75) Inventor: Sang Sik Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 425 days.

(21) Appl. No.: 11/616,773

(22) Filed: Dec. 27, 2006

(65) Prior Publication Data

US 2007/0148372 A1    Jun. 28, 2007

(30) Foreign Application Priority Data

Dec. 28, 2005    (KR) ...................... 10-2005-0131365

(51) Int. Cl.
*H01L 31/062*    (2006.01)
(52) U.S. Cl. ............... 257/294; 257/432; 257/E31.121; 257/E31.127; 257/E27.134; 438/27; 438/69
(58) Field of Classification Search ................. 257/294, 257/432, E31.121, E31.127, E27.134; 438/27, 438/48, 65, 75, 69; 359/619, 620
See application file for complete search history.

(56) References Cited

U.S. PATENT DOCUMENTS

| | | | | |
|---|---|---|---|---|
| 2004/0223071 | A1* | 11/2004 | Wells et al. | ........... 348/340 |
| 2005/0041296 | A1* | 2/2005 | Hsiao et al. | ........... 359/619 |
| 2006/0086957 | A1* | 4/2006 | Kang | ........... 257/292 |

* cited by examiner

*Primary Examiner*—Minh-Loan T Tran
(74) *Attorney, Agent, or Firm*—Sherr & Vaughn, PLLC

(57) ABSTRACT

Embodiments relate to a method of manufacturing an image sensor. According to embodiments, the method may include preparing a semiconductor substrate formed with a plurality of photodiodes, forming an interlayer dielectric layer on the semiconductor substrate, forming a color filter layer on the interlayer dielectric layer, forming a planar layer on the color filter layer, and forming micro-lenses coated with fat-soluble polymer on the planar layer. Since the micro-lens is uniformly formed due to the fat-soluble polymer coated on the microlens, the photo-sensitivity and color reproduction of the image sensor are improved, resulting in the high-quality image sensor.

19 Claims, 8 Drawing Sheets

IMAGE SENSOR

The present application claims priority under 35 U.S.C. 119 and 35 U.S.C. 365 to Korean Patent Application No. 10-2005-0131365 (filed on Dec. 28, 2005), which is hereby incorporated by reference in its entirety.

BACKGROUND

An image sensor may be a semiconductor device for converting optical images into electric signals. An image sensor may be generally classified into a charge coupled device (CCD) image sensor and a CMOS image sensor.

An image sensor may include a photodiode for detecting light and a logic circuit for converting detected light into electric signals. Thus, light that is detected may be represented as data. As a quantity of light received in the photodiode increases, the photo sensitivity of the image sensor may be improved.

Photo sensitivity may be improved by various methods. For example, a fill factor, which may be a ratio of a photodiode area to the whole area of the image sensor, may be increased. Alternatively, photo-gathering technology may be used to change a path of light incident onto an area other than the photodiode area such that the light may be gathered in the photodiode.

A micro-lens is an example of the photo-gathering technology. For example, a convex micro-lens may be formed on a top surface of a photodiode. The micro-lens may be formed using a material having superior light transmittance. The micro-lens may refract a path of incident light in such a manner that a greater amount of light may be transmitted into the photo-diode area. Hence, light parallel to an optical axis of the micro-lens may be refracted by the micro-lens, and light may be focused at a specific position on the optical axis.

A related art image sensor may include various components, such as a photodiode, an interlayer dielectric layer, a color filter, a micro-lens, and so on.

An interlayer dielectric layer may be formed on a semiconductor substrate formed with a plurality of photodiodes. RGB color filter layers may be formed on the interlayer dielectric layer and may correspond with the photodiodes, respectively.

A planar layer may be formed on the color filter layers and may planarize an irregular surface that may occur on the color filter layers. In addition, micro-lenses may be formed on the planar layer to correspond (i.e. be aligned) with the photodiodes and the color filter layers, respectively.

The photodiode may detect light and may convert the light into an electric signal. The interlayer dielectric layer may insulate metal interconnections from each other. The color filter may exhibit the three primary colors of red, green, and blue (R, G, B). The micro-lens may guide the light onto the photodiode.

FIGS. 1A to 1D illustrate a related art method of manufacturing a micro-lens.

Figure 1A:
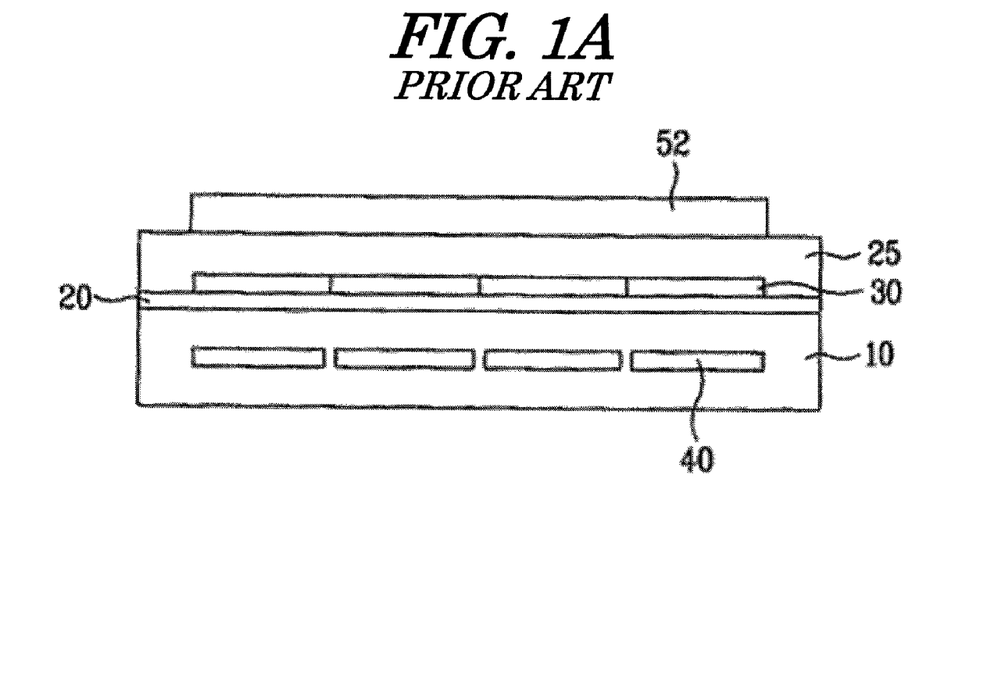
FIGS. 1A to 1D are example diagrams illustrating a procedure for forming a related art micro-lens.

Referring to FIG. 1A, micro-lens layer 52 may be formed on semiconductor substrate 10 on which a plurality of photodiodes 40, an interlayer dielectric layer 20, a color filter layer 30, and a planar layer 25 may be formed.

Figure 1B:
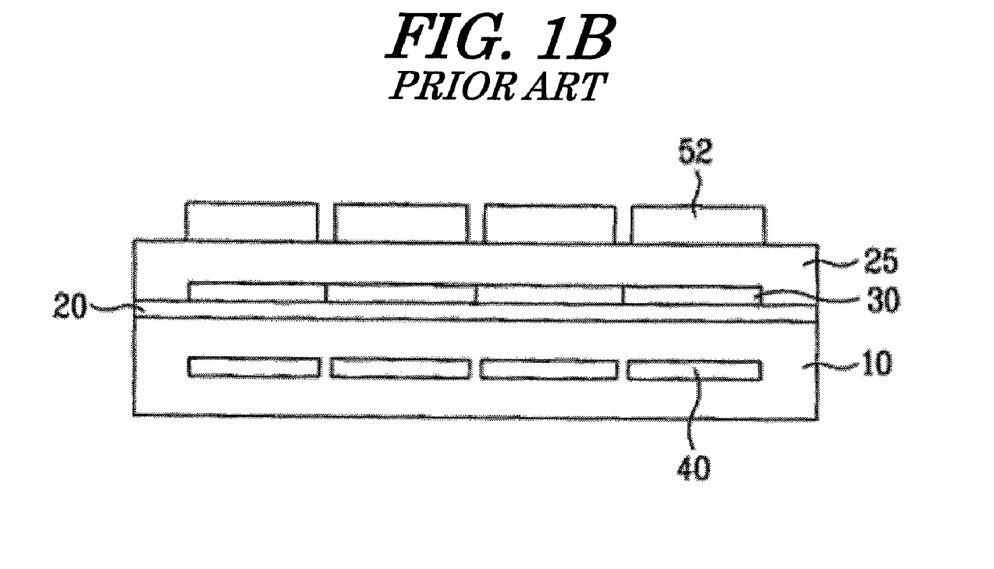

Referring to FIG. 1B, micro-lens layer 52 may be patterned such that a micro-lens pattern may correspond to locations of to photodiodes 40.

Figure 1C:
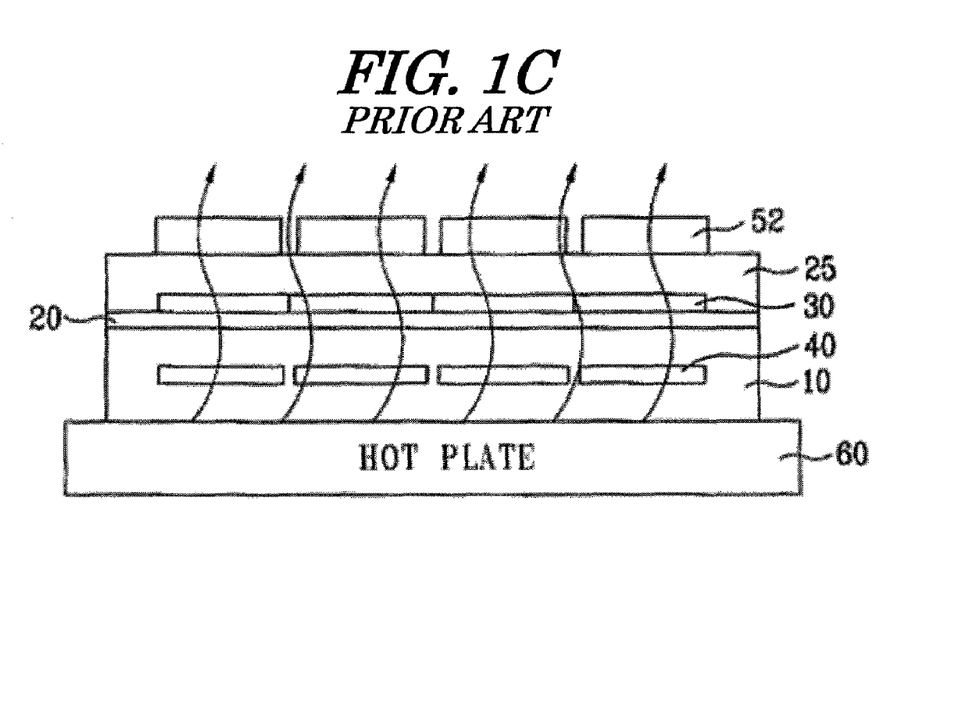

Referring to FIG. 1C, semiconductor substrate 10 may be loaded on hot plate 60 and heat may be applied to semiconductor substrate 10. Accordingly, the micro-lens may be formed.

Figure 1D:
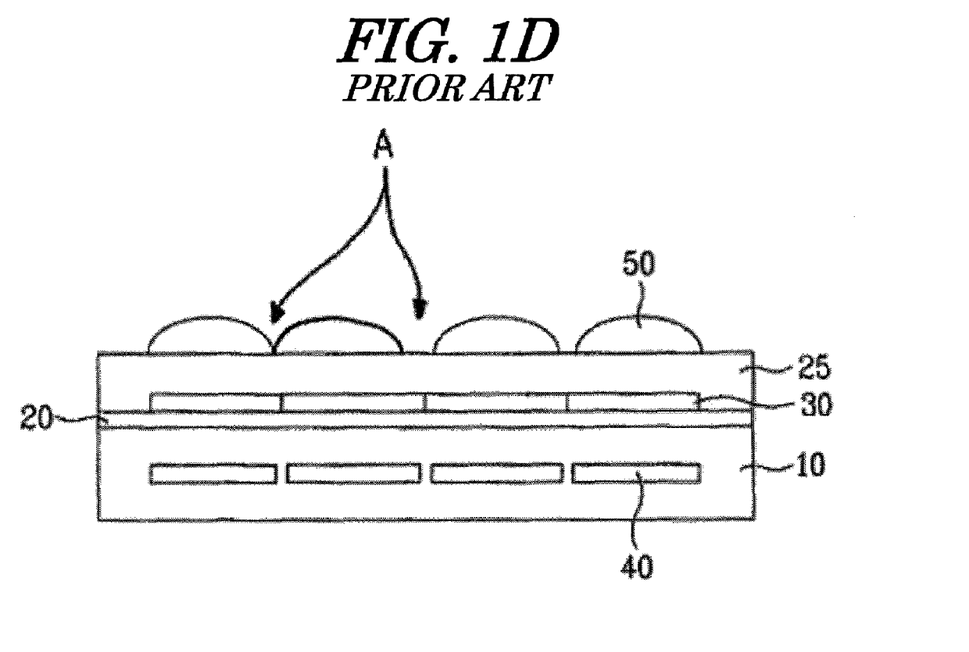

Referring to FIG. 1D, as illustrated in portions A and B, micro-lens 50 of the image sensor manufactured through the related art method may have an irregular surface.

If heat is applied to semiconductor substrate 10 to form the curvature surface of micro-lens 50, micro-lens 50 may be moved. Micro-lens 50 may be bonded to an adjacent micro-lens 50, and micro-lens 50 may have an irregular surface. This may negatively affect pixels adjacent to micro-lens 50 and may degrade a focusing efficiency of a micro-lens.

SUMMARY

Embodiments relate to an image sensor. Embodiments relate to a method of manufacturing an image sensor that may be capable of forming a uniform micro-lens.

Embodiments relate to a method of manufacturing an image sensor that may be capable of forming uniform micro-lenses by preventing micro-lenses from being bonded to each other using fat-soluble polymer coated on the micro-lenses.

In embodiments, a method of manufacturing an image sensor may include preparing a semiconductor substrate formed with a plurality of photodiodes, forming an interlayer dielectric layer on the semiconductor substrate, forming a color filter layer on the interlayer dielectric layer, forming a planar layer on the color filter layer, and forming micro-lenses coated with fat-soluble polymer on the planar layer.

In embodiments, planar layer formed on the color filter layer may have a thickness in a range of 0.5 µm to 1.5 µm.

In embodiments, forming the micro-lens coated with fat-soluble polymer on the planar layer may include forming a micro-lens layer on the planar layer, patterning the micro-lens layer, coating the patterned micro-lens layer with the fat-soluble polymer, and loading the semiconductor substrate including the patterned micro-lens layer on a hot plate and then applying heat to the semiconductor substrate, thereby forming a curvature surface of the micro-lens.

In embodiments, the fat-soluble polymer may be coated on the patterned micro-lens layer through a metal organic chemical vapor deposition (MOCVD) process. In embodiments, the fat-soluble polymer may be coated on the patterned micro-lens layer through an atomic layer deposition (ALD) process. In embodiments, the fat-soluble polymer may be coated on the patterned micro-lens layer at a thickness in a range of 1 nm to 50 nm.

DETAILED DESCRIPTION OF EMBODIMENTS

Figure 2A:
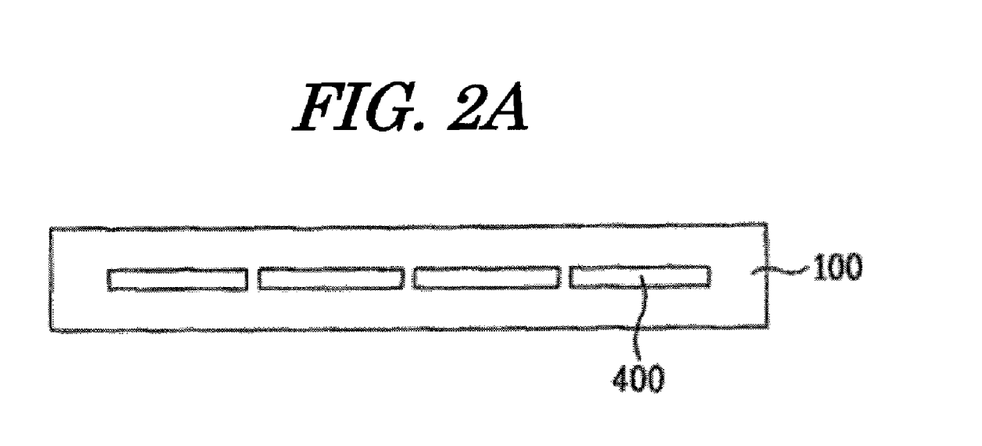
FIGS. 2A to 2E are example diagrams illustrating a micro-lens and a procedure for manufacturing an image sensor according to embodiments.

Referring to FIG. 2A, semiconductor substrate 100 may be formed with a plurality of photodiodes 400.

Figure 2B:
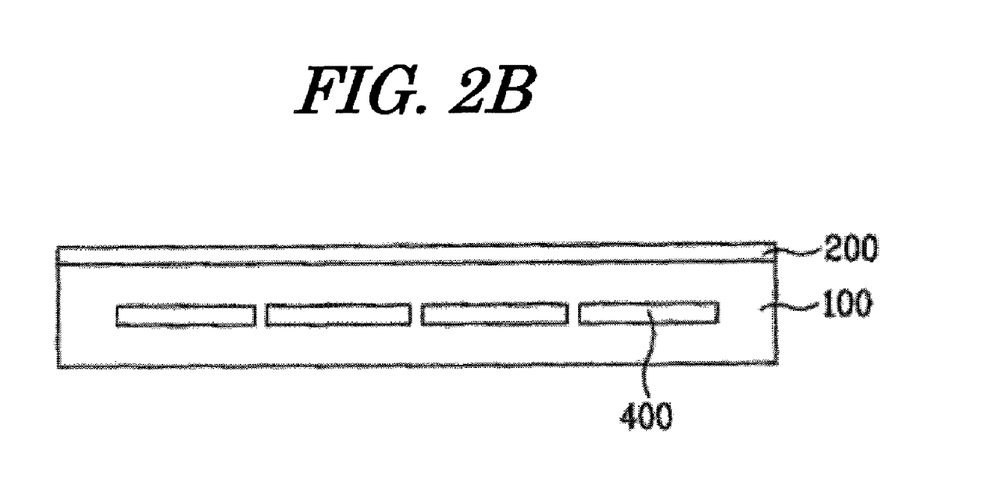

Referring to FIG. 2B, interlayer dielectric layer 200 may be formed on semiconductor substrate 100 including photodiodes 400. Interlayer dielectric layer 200 may include SiN or SiON.

Figure 2C:
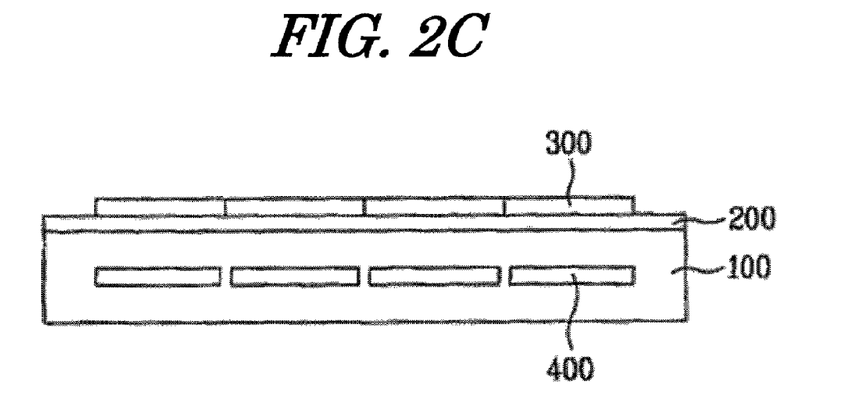

Referring to FIG. 2C, color filter layers 300 may be formed on interlayer dielectric layer 200. In embodiments, color filter layers 300 may be aligned corresponding to photodiodes 400, respectively.

Figure 2D:
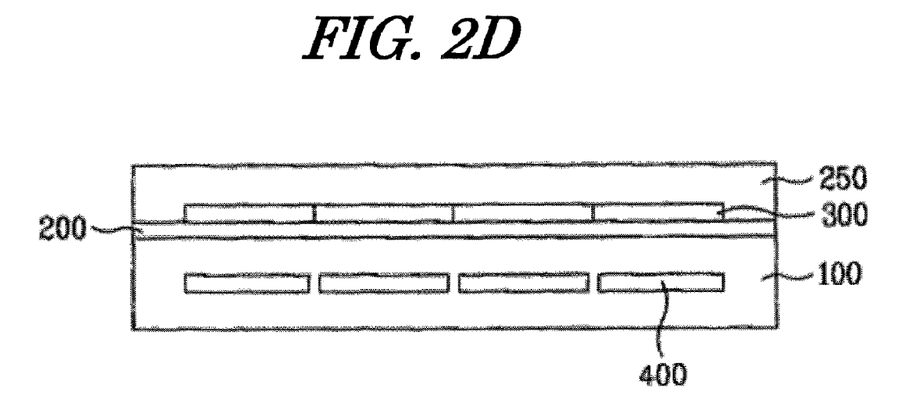

Referring to FIG. 2D, planar layer 250 may be formed on color filter layer 300. Planar layer 250 may include organic materials that may have a thickness of about 0.5 μm to 1.5 μm and may have superior transparency in a visible spectrum. Planar layer 250 may effectively protect color filter layers 300, and may make it more easy to form the micro-lens (not shown) on planar layer 250, and to adjust the focal length.

Figure 2E:
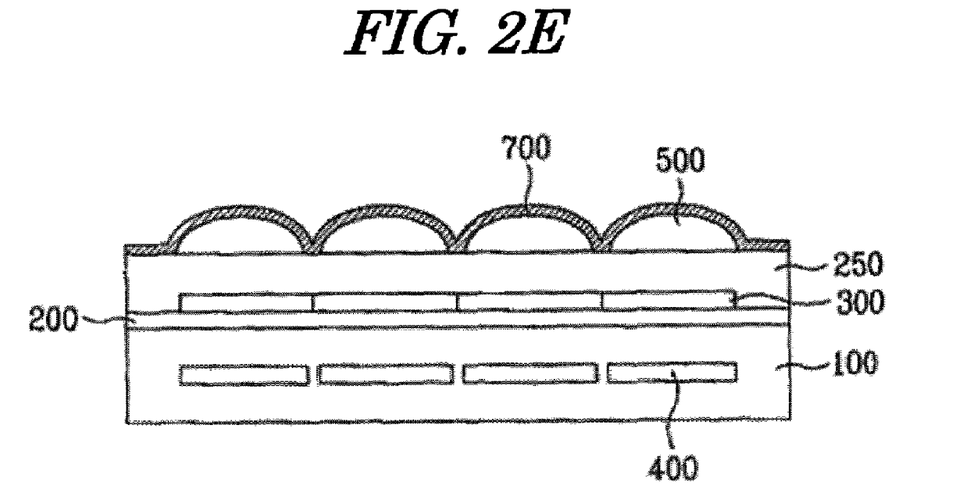

Referring to FIG. 2E, micro-lenses 500 may be formed on planar layer 250. Micro-lenses 500 may be coated with fat-soluble polymer 700. The image sensor may thereby be formed. In embodiments, micro-lenses 500 may be aligned to correspond to positions of photodiodes 400 and color filter layers 300, respectively.

Fat-soluble polymer 700 that may be coated on micro-lenses 500 may allow micro-lenses 500 to have uniform surfaces and may prevent micro-lenses 500 from being bonded to each other when formed.

FIGS. 3A to 3E are example diagrams illustrating a micro-lens and a procedure for manufacturing a micro-lens according to embodiments.

Figure 3A:
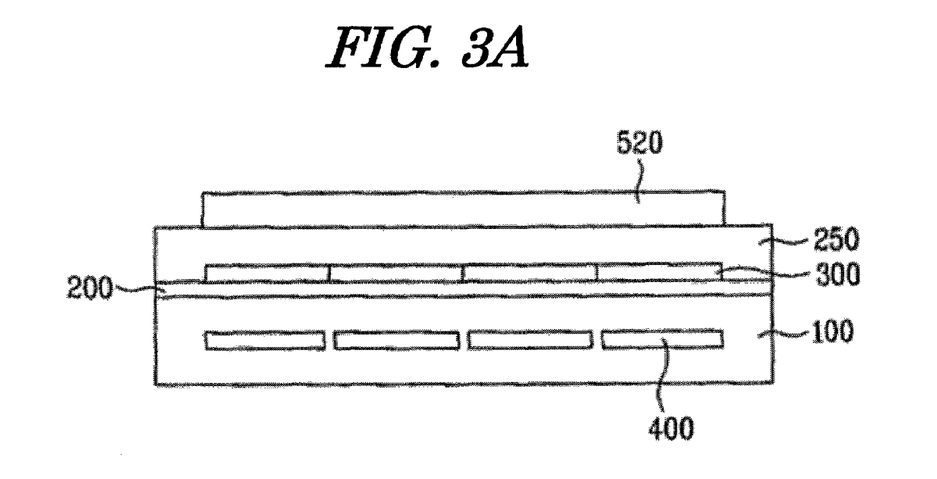
FIGS. 3A to 3E are example diagrams illustrating a micro-lens and a procedure for manufacturing a micro-lens according to embodiments.

Referring to FIG. 3A, micro-lens layer 520 may be formed on a semiconductor substrate 100. Semiconductor substrate 100 may include plurality of photodiodes 400, interlayer dielectric layer 200, color filter layer 300, and planar layer 250. Micro-lens layer 520 may include a photoresist or a material having insulating property and allowing light to pass therethrough.

Figure 3B:
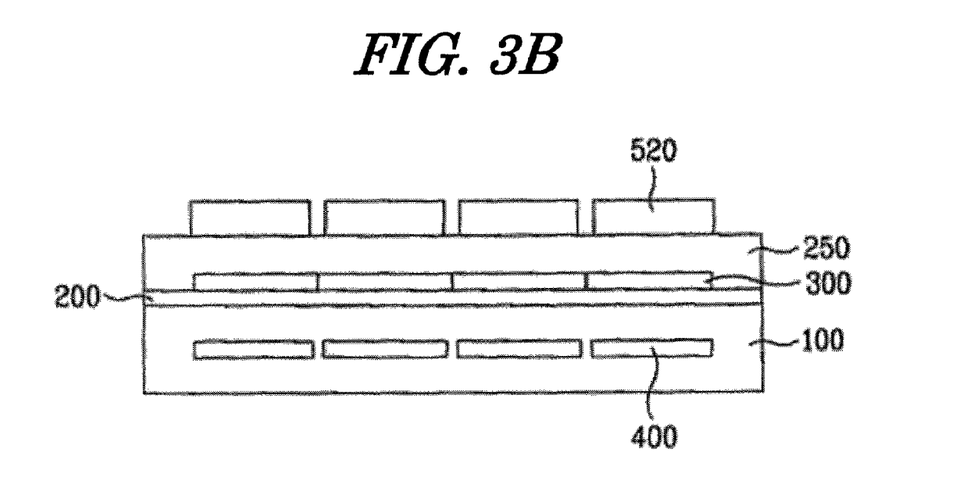

Referring to FIG. 3B, micro-lens layer 520 may be patterned such that the micro-lens pattern can correspond to locations of photodiodes 400.

A mask having a predetermined pattern may be placed on micro-lens layer 520. Light may then be irradiated onto micro-lens layer 520. A development process may be performed so as to pattern micro-lens layer 520.

Figure 3C:
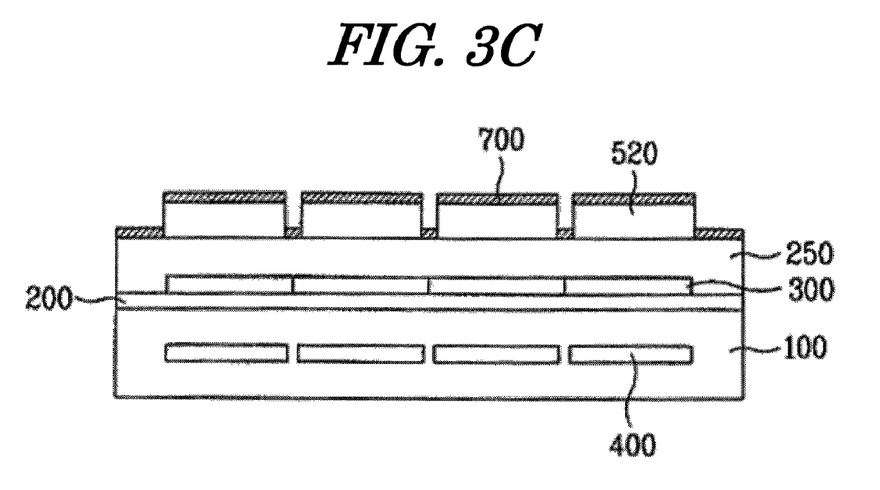

Referring to FIG. 3C, fat-soluble polymer 700 may be coated on patterned micro-lens layer 520. According to embodiments, a thickness of the coating of fat-soluble polymer 700 may be in a range of 1 nm to 50 nm.

In embodiments, fat-soluble polymer 700 may be coated on patterned micro-lens layer 520 through a metal organic chemical vapor deposition (MOCVD) process.

According to the MOCVD process, steam of fat-soluble polymer 700, which may have a high vapor pressure, may be provided onto a surface of the heated semiconductor substrate 100. This may form a thin film on semiconductor substrate 100.

In embodiments, an MOCVD process may not cause damage to the substrate or a crystalline surface. In addition, a deposition speed may be relatively high, so a process time may be shortened. Thus, it may be possible to form a thin film having high-purity and high-quality.

In embodiments, fat-soluble polymer 700 may be coated on patterned micro-lens layer 520 through an atomic layer deposition (ALD) process.

The ALD process may use a nano thin film deposition technology utilizing the monatomic phenomenon, in which atoms may chemically stick to each other during the semiconductor manufacturing process. The ALD process may deposit an ultra-micro thin film having a thickness corresponding to a thickness of an atomic layer on semiconductor substrate 100 by repeating absorption and substitution of molecules of fat-soluble polymer 700.

In embodiments, the ALD process may make the film as thin as possible and may form the film under a relatively low temperature condition as compared with the MOCVD process.

Figure 3D:
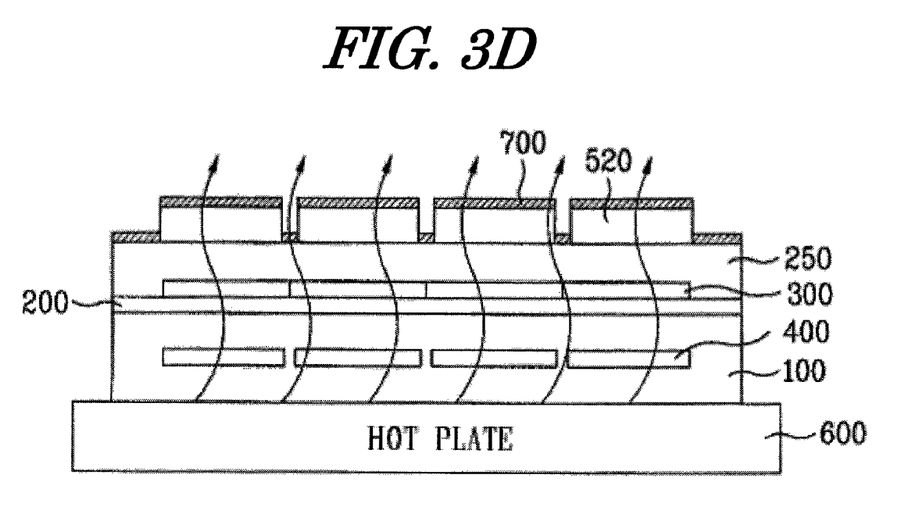

Referring to FIG. 3D, semiconductor substrate 100 including patterned micro-lens layer 520 may be loaded on hot plate 600. Heat may then be applied to semiconductor substrate 100 in such a manner that the micro-lens may be formed with the uniform curvature surface.

Figure 3E:
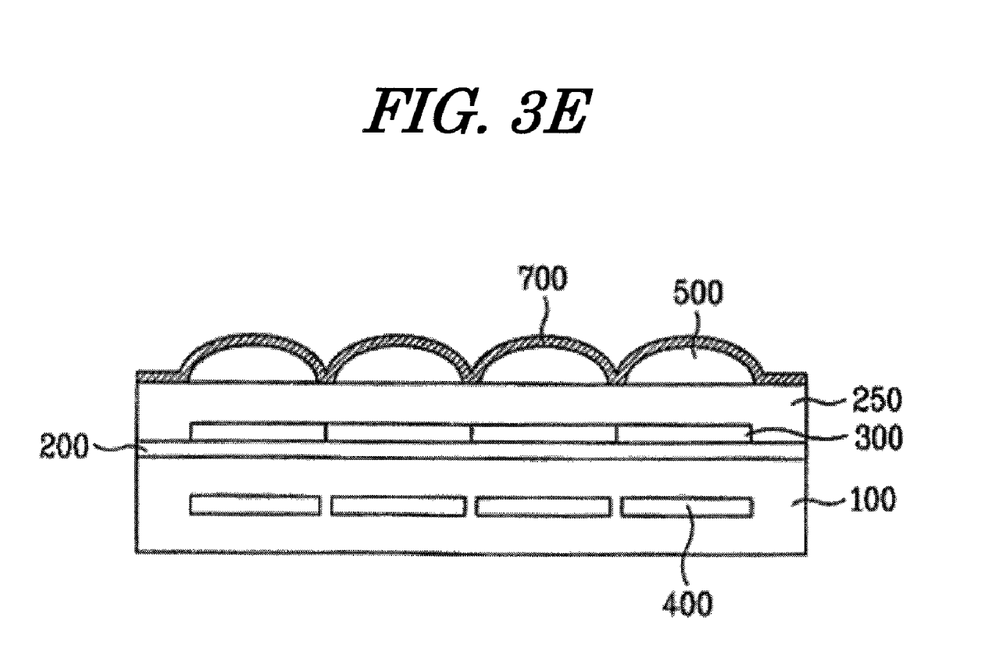

In embodiments, if the manufacturing process is performed after forming fat-soluble polymer 700 on micro-lenses 500, as shown in FIG. 3e, micro-lenses 500 may be spaced apart from each other at uniform intervals. In embodiments, since fat-soluble polymer 700 may exist between micro-lenses 500, micro-lenses 500 may not be bonded to each other.

According to embodiments, if heat is applied to the semiconductor substrate to allow the micro-lenses to have the uniform curvature surface, the micro-lenses may be coated with fat-soluble polymer to prevent the micro-lenses from being bonded to each other. Thus, adjacent micro-lenses may not be bonded to each other.

According to embodiments, since the adjacent micro-lenses may not be bonded to each other, a size of the micro-lens may be enlarged corresponding to the pixel size. Accordingly, it may be possible to fabricate an image sensor having high photo sensitivity.

In embodiments, if a size of the micro-lens is enlarged corresponding to a pixel size, the micro-lenses may be uniformly formed because there may be no difference in size of the micro-lens relative to the pixels.

In embodiments, such improvement of the photo sensitivity and uniformity may lead to superior color reproduction. An image sensor having high quality may thus be obtained.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   preparing a semiconductor substrate having a plurality of photodiodes;
   forming an interlayer dielectric layer over the semiconductor substrate;
   forming a planar layer over the interlayer dielectric layer; and
   forming micro-lenses over the planar layer using a micro-lens layer coated with a fat-soluble polymer.

2. The method of claim 1, wherein forming the micro-lenses comprises:
   forming the micro-lens layer over the planar layer;
   patterning the micro-lens layer to form a pattern for the micro-lenses;
   coating the patterned micro-lens layer with the fat-soluble polymer; and
   applying heat to the semiconductor substrate, thereby forming a curvature surface of the micro-lenses.

3. The method of claim 2, further comprising loading the semiconductor substrate including the patterned micro-lens layer on a hot plate to apply the heat.

4. The method of claim 2, wherein the fat-soluble polymer is coated on the patterned micro-lens layer using a metal organic chemical vapor deposition (MOCVD) process.

5. The method of claim 2, wherein the fat-soluble polymer is coated on the patterned micro-lens layer using an atomic layer deposition (ALD) process.

6. The method of claim 2, wherein the fat-soluble polymer is coated on the patterned micro-lens layer to have a thickness in a range of 1 nm to 50 nm.

7. The method of claim 1, wherein the planar layer has a thickness in a range of 0.5 μm to 1.5 μm.

8. The method of claim 1, further comprising forming a color filter layer over the interlayer dielectric layer.

9. A device, comprising:
 a semiconductor substrate having a plurality of photodiodes;
 an interlayer dielectric layer over the semiconductor substrate;
 a planar layer over the interlayer dielectric layer; and
 a plurality of micro-lenses over the planar layer, the micro-lenses being formed by coating a micro-lens layer with fat-soluble polymer.

10. The device of claim 9, further compromising a color filter layer over the interlayer dielectric layer.

11. The device of claim 9, wherein forming the micro-lenses comprises:
 forming the micro-lens layer over the planar layer;
 patterning the micro-lens layer to form a pattern for the micro-lenses;
 coating the patterned micro-lens layer with the fat-soluble polymer; and
 applying heat to the semiconductor substrate, thereby forming a curvature surface of the micro-lenses.

12. The device of claim 11, wherein the heat is provided by loading the semiconductor substrate including the patterned micro-lens layer on a hot plate.

13. The device of claim 11, wherein the fat-soluble polymer is coated on the patterned micro-lens layer using a metal organic chemical vapor deposition (MOCVD) process.

14. The device of claim 11, wherein the fat-soluble polymer is coated on the patterned micro-lens layer using an atomic layer deposition (ALD) process.

15. The device of claim 11, wherein a thickness of the fat-soluble polymer is in a range of 1 nm to 50 nm.

16. The device of claim 9, wherein the planar layer comprises an organic compound having a thickness the planar layer is in a range of 0.5 μm to 1.5 μm.

17. A method, comprising:
 forming a patterned micro-lens layer over a semiconductor substrate, the semiconductor substrate having a plurality of photodiodes formed thereon;
 coating the patterned micro-lens layer with fat-soluble polymer; and
 forming a plurality of micro-lenses over a planar layer corresponding to locations of the photodiodes by heating the semiconductor substrate.

18. The method of claim 17, wherein the fat-soluble polymer is coated on the patterned micro-lens layer using one of a metal organic chemical vapor deposition (MOCVD) process and an atomic layer deposition (ALD) process, and wherein the fat-soluble polymer is coated to have a thickness in a range of 1 nm to 50 nm.

19. The method of claim 18, further comprising:
 forming an interlayer dielectric layer over the semiconductor substrate;
 forming a color filter layer over the interlayer dielectric layer; and
 forming said planar layer over the color filter layer, wherein the planar layer comprises an organic material having a thickness of approximately 0.5 μm to 1.5 μm.

* * * * *